(12) United States Patent
Han et al.

(10) Patent No.: US 10,139,980 B2
(45) Date of Patent: Nov. 27, 2018

(54) TOUCH WINDOW

(71) Applicant: LG INNOTEK CO., LTD., Seoul (KR)

(72) Inventors: Jung Hyuck Han, Seoul (KR); Yu Lim Choe, Seoul (KR); Chan Kyu Koo, Seoul (KR); Jun Sik Shin, Seoul (KR); Joon Hyuk Yang, Seoul (KR); Seung Jin Lee, Seoul (KR); Yu Hong Jeon, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 15/709,767

(22) Filed: Sep. 20, 2017

(65) Prior Publication Data

US 2018/0024673 A1    Jan. 25, 2018

Related U.S. Application Data

(63) Continuation of application No. 14/814,730, filed on Jul. 31, 2015, now Pat. No. 9,891,769.

(51) Int. Cl.
*G06F 3/044* (2006.01)
*H05K 1/02* (2006.01)
*H05K 3/28* (2006.01)

(52) U.S. Cl.
CPC ........... *G06F 3/044* (2013.01); *H05K 1/0296* (2013.01); *H05K 3/28* (2013.01);
(Continued)

(58) Field of Classification Search
CPC ........ G06F 3/044; G06F 3/041; G06F 3/0411; G06F 3/047; G06F 2203/04112; G06F 2203/04103
See application file for complete search history.

(56) References Cited

U.S. PATENT DOCUMENTS 9,594,454 B2    3/2017   Kida
2009/0051668 A1*  2/2009  Cheng .................... G06F 3/044
                                                    345/173

(Continued)

FOREIGN PATENT DOCUMENTS

EP          2738653 A2    6/2014
KR    10-2014-0078563 A   6/2014
(Continued)

OTHER PUBLICATIONS

European Search Report, dated Mar. 29, 2016, for European Patent Application No. 15181253.4 which corresponds to the above-referenced U.S. application.

*Primary Examiner* — Md Saiful A Siddiqui
(74) *Attorney, Agent, or Firm* — LRK Patent Law Firm

(57) ABSTRACT

A capacitive touch window includes: a substrate; a cover substrate; and an electrode, wherein a portion of the substrate is flat and another portion thereof is curved, and the electrode includes: a first sensing electrode; a second sensing electrode including second unit sensing electrodes spaced apart from the first sensing electrode; a bridge electrode connecting the second unit sensing electrodes; and an insulating layer between the first sensing electrode and the bridge electrode. The first and second sensing electrodes are disposed on a same surface of the substrate. The bridge electrode includes: a first mesh line having a first width; a second mesh line having a second width; and a first cross area in which the first and second mesh lines cross each other, the first cross area having a third width, wherein the third width is 2 to 5 times the first width and the second width.

31 Claims, 19 Drawing Sheets

(52) U.S. Cl.
CPC .............. *G06F 2203/04112* (2013.01); *H05K 2201/09245* (2013.01); *H05K 2201/09272* (2013.01)

(56) References Cited

U.S. PATENT DOCUMENTS

| | | | |
|---|---|---|---|
| 2011/0069022 A1* | 3/2011 | Yokota | G06F 3/0416 345/173 |
| 2012/0133618 A1 | 5/2012 | Usukura | |
| 2012/0261242 A1 | 10/2012 | Guard | |
| 2013/0011644 A1* | 1/2013 | Chu | B32B 27/18 428/216 |
| 2013/0082944 A1* | 4/2013 | Juan | G06F 3/0412 345/173 |
| 2014/0104511 A1* | 4/2014 | Liu | G06F 3/01 349/12 |
| 2014/0152917 A1 | 6/2014 | Lee et al. | |
| 2014/0172379 A1 | 6/2014 | Chang et al. | |
| 2014/0184936 A1 | 7/2014 | Oh et al. | |
| 2014/0333555 A1* | 11/2014 | Oh | G06F 3/044 345/173 |
| 2015/0132583 A1* | 5/2015 | Pokorny | C08F 2/48 428/422 |
| 2016/0011713 A1 | 1/2016 | Kida | |
| 2016/0018932 A1 | 1/2016 | Nakayama | |
| 2017/0336859 A1* | 11/2017 | Liu | G06F 3/041 |

FOREIGN PATENT DOCUMENTS

| | | |
|---|---|---|
| KR | 10-2014-0084880 A | 7/2014 |
| WO | 2014/156340 A1 | 10/2014 |
| WO | 2014/156364 A1 | 10/2014 |

* cited by examiner

TOUCH WINDOW

CROSS-REFERENCE TO RELATED APPLICATIONS

The present application is a continuation of U.S. patent application Ser. No. 14/814,730, filed Jul. 31, 2015, which claimed priority to Korean Patent Application Nos. 10-2014-0165618 and 10-2014-0177605, filed Nov. 25, 2014 and Dec. 10, 2014, respectively, the disclosures of which are incorporated by reference in their entireties herein.

BACKGROUND OF THE INVENTION

1. Field of the Invention

The embodiment relates to a touch window.

2. Description of Related Art

Recently, a touch window, which performs an input function through the touch of an image displayed on a display device by an input device, such as a stylus pen or a finger, has been applied to various electronic appliances.

For example, the touch window may include a substrate on which a sensing electrode and a wire electrode connected to the sensing electrode are disposed, and the position of the touch point may be detected by detecting the variation of capacitance when the area in which the sensing electrode is disposed is touched.

A metallic material may be used as a material of the sensing electrode. Since the metallic material is not a transparent material, the sensing electrode may be formed by crossing a plurality of mesh lines having fine line widths.

In this case, due to a cross area in which the mesh lines cross each other, and a difference between the mesh lines in width or area, the difference may be viewed from an outside, so that the visibility may be degraded. In addition, due to the difference, the sheet resistance may not be uniform, so that the touch efficiency may be deteriorated.

In addition, an electrode may be damaged by an external shock, so that the reliability may be deteriorated.

Therefore, there is a need to provide a touch window having a new structure which may solve the above-mentioned problems.

SUMMARY

The embodiment provides a touch window having improved reliability and a thin thickness.

According to the embodiment, there is provided a touch window which includes a substrate; and an electrode on the substrate, wherein the electrode includes a first mesh line extending in a first direction and having a first width; a second mesh line extending in a direction different from the first direction and having a second width; and an cross area in which the first and second mesh lines cross each other, the cross area having a third width, wherein the third width is larger than the first width, and the third width is equal to or less than 10 times of the first width.

In addition, the touch window according to the embodiment may further include a protective layer disposed on a lower portion of the electrode layer.

According to the touch window of the embodiment, the widths of the mesh lines crossing each other and the cross area of the mesh lines may be controllable.

In detail, the widths of the mesh lines and the width of the cross area may be controlled at a predetermined ratio, so that the visibility may be prevented from being deteriorated due to the difference between the mesh lines and the cross area in width and the efficiency may be prevented from being deteriorated due to non-uniform resistance.

In addition, by allowing the widths of the mesh lines to be gradually narrowed toward the cross area, the width of the cross area may be prevented from being too much larger than those of the mesh lines.

In addition, by controlling the cross angles of the mesh lines to be in a predetermined range, the width of the cross area may be prevented from being too much larger than those of the mesh lines.

Thus, the touch window according to the embodiment may have improved reliability, visibility and touch efficiency.

In addition, the touch window according to the embodiment may include a protective layer including resin composition which has a thin thickness and is disposed on an electrode layer.

In addition, the resin composition may have an adhesive property and an anti-scattering function. Further, acrylic based resin, silicon based resin and urethane based resin have superior durability, so that the electrode layer may be prevented from being cracked or short-circuited due to an external shock by the protective layer that surrounds the electrode layer.

In addition, the anti-scattering, adhesion and electrode protection all may be implemented by the protective layer at once without the need to dispose each functional layer, so that the thickness of the touch window may be reduced.

Thus, the touch window according to an embodiment may have improved reliability and a thin thickness due to the protective layer.

DETAILED DESCRIPTION OF THE EMBODIMENTS

Figure 1:
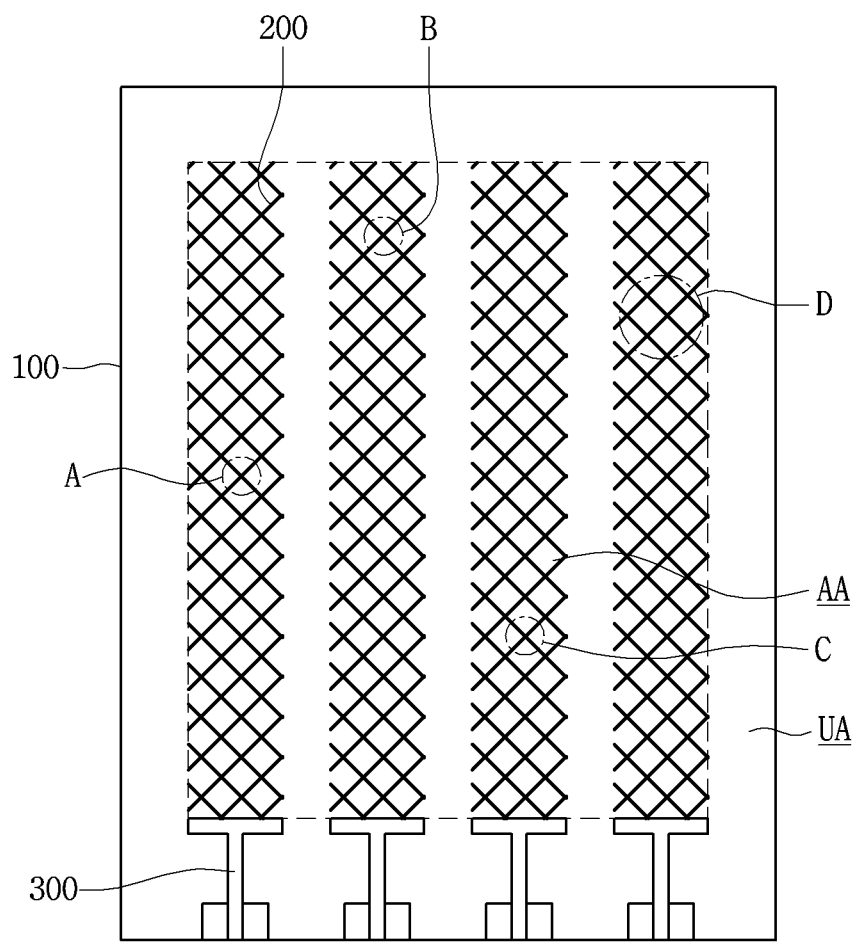
FIG. 1 is a plan view of a touch window according to the first embodiment

In the following description of the embodiments, it will be understood that, when a layer (film), a region, a pattern or a structure is referred to as being "on" or "under" a substrate, another layer (film), region, pad or patterns, it can be "directly" or "indirectly" on the other layer (film), region, pattern or structure, or one or more intervening layers may also be present. Such a position of each layer will be described with reference to the drawings.

In addition, when a predetermined part "is connected to" another part, this means not only that the predetermined part is directly connected to another part, but also that the predetermined is indirectly connected to another part while interposing another component between the predetermined part and another part. In addition, when a predetermined part "includes" a predetermined component, the predetermined part does not exclude other components, but may further include other components unless indicated otherwise.

The thickness and size of each layer (film), region, pattern or structure shown in the drawings may be modified, so the size of elements shown in the drawings does not utterly reflect an actual size.

Hereinafter, embodiments will be described with reference to accompanying drawings.

Referring to FIG. 1, the touch window according to an embodiment may include a substrate 100, a sensing electrode and a wire electrode 300.

The substrate 100 may be rigid or flexible. For example, the protective substrate 100 may include glass or plastic. In detail, the substrate 100 may include chemically tempered/half-tempered glass such as soda lime glass or aluminosilicate glass, reinforced or flexible plastic such as polyimide (PI), polyethylene terephthalate (PET), propylene glycol (PPG), or polycarbonate (PC), or sapphire.

In addition, the substrate 100 may include an optically isotropic film. For example, the substrate 100 may include cyclic olefin copolymer (COC), cyclic olefin polymer (COP), optically isotropic polycarbonate (PC), or optically isotropic polymethyl methacrylate (PMMA).

The sapphire has superior electric characteristics, such as permittivity, so that a touch response speed may be greatly increased and a space touch such as hovering may be easily implemented. In addition, since the sapphire has high surface hardness, the sapphire is applicable to a cover substrate. The hovering refers to a technique of recognizing coordinates even at a slight distance from a display.

In addition, a portion of the substrate 100 may be curved with a partial curved surface. That is, a portion of the substrate 100 may have a flat surface, and another portion of the substrate 100 may be curved with a curved surface. In detail, an end portion of the substrate 100 may be curved with a curved surface or may be curved or bent with a surface having a random curvature.

In addition, the substrate 100 may include a flexible substrate having a flexible property.

In addition, the substrate 100 may include a curved or bended substrate. That is, a touch window including the substrate 100 may be formed to have a flexible, curved or bended property. For this reason, the touch window according to the embodiment may be easily portable and may be variously changed in design.

The sensing and wire electrodes may be disposed on the substrate 100. That is, the substrate 100 may serve as a support substrate.

The substrate 100 may include a cover substrate. That is, the sensing and wire electrodes may be supported by the cover substrate. In addition, an additional cover substrate may be further disposed on the substrate 100. That is, the sensing and wire electrodes may be supported by the substrate 100, and the substrate 100 and the cover substrate may be combined with each other through an adhesive layer. Thus, since the cover substrate and the substrate may be formed separately from each other, it may be advantageous for the mass production of the touch window.

The substrate 100 may have an active area AA and an unactive area UA defined therein.

An image may be displayed on the active area AA. The image is not displayed on the unactive area UA provided at a peripheral portion of the active area AA.

In addition, the position of an input device (e.g., finger) may be sensed in at least one of the active area AA and the unactive area UA. If the input device, such as a finger, touches the touch window, the variation of capacitance occurs in the touched part by the input device, and the touched part subject to the variation of the capacitance may be detected as a touch point.

The sensing electrode 200 may be disposed on the substrate 100. For example, the sensing electrode 200 may be disposed on at least one of the active and unactive areas AA and UA. Preferably, the sensing electrode 200 may be disposed on the active area AA of the substrate 100.

The sensing electrode 200 may include a transparent conductive material that allows electricity to flow therethrough without interrupting transmission of light. For example, the sensing electrode 200 may include metal oxide such as indium tin oxide (ITO), indium zinc oxide (IZO), copper oxide, tin oxide, zinc oxide, or titanium oxide. Thus, since the transparent material is disposed on the active area, the degree of pattern freedom in forming the pattern of the sensing electrode may be improved.

Alternatively, the sensing electrode 200 may include a nanowire, a photosensitive nanowire film, a carbon nanotube (CNT), graphene, conductive polymer or a mixture thereof. Thus, when a flexible and/or bendable touch window is manufactured, the degree of freedom may be improved.

When a nano-composite such as a nanowire or a carbon nanotube (CNT) is used, the sensing electrode 200 may be formed to have a black color and there is a merit capable of controlling the color and reflectance while securing electric conductivity through the content control of nano-powder.

Alternatively, the sensing electrode 200 may include various metals. For example, the sensing electrode 200 may include at least one of Cr, Ni, Cu, Al, Ag, Mo, Au, Ti and the alloy thereof. Thus, when a flexible and/or bendable touch window is manufactured, the degree of freedom may be improved.

The sensing electrode 200 may include a mesh shape. For example, the sensing electrode may include a plurality of mesh lines and a mesh electrode in which the mesh lines are disposed in a mesh shape while crossing each other.

Figure 2:
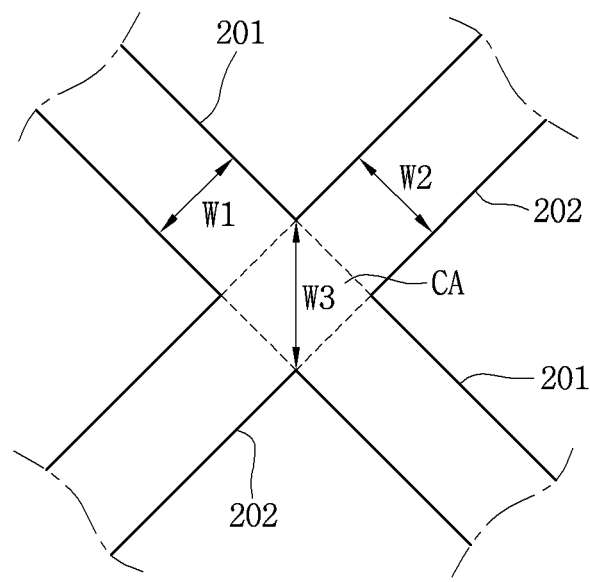
FIG. 2 is an enlarged view of an A region shown in FIG. 1.

Referring to FIG. 2, the sensing electrode 200 may include a mesh line. In detail, the sensing electrode 200 may include a mesh line including first and second mesh lines 201 and 202. For example, the sensing electrode 200 may include the first mesh line 201 extending in a first direction and having a first width W1 and a second mesh line 202 extending in a direction different from the first direction and having a second width W2.

The first and second mesh lines 201 and 202 may cross each other. In addition, the first and second mesh lines 201 and 202 may include a plurality of mesh lines. Thus, as a plurality of first mesh lines 201 and a plurality of second mesh lines 202 cross each other, the sensing electrode 200 may be entirely formed in a mesh shape by the first and second mesh lines 201 and 202.

Since the first and second mesh lines 201 and 202 cross each other, a cross area CA may be formed in the mesh line.

For example, the mesh line may include a cross area CA having a third width W3 as the first mesh lines 201 cross the second mesh lines 202.

The first to third widths W1 to W3 may be equal or similar to each other or different from each other. For example, the first and second widths W1 and W2 may correspond to each other. That is, the first width W1 may be equal or similar to the second width W2. For example, the first to third widths W1 to W3 may be equal or similar to or different from each other in the range of about 0.1 μm to about 10 μm.

In addition, thicknesses of the first and second mesh lines 201 and 202 may be in the range of about 100 nm to about 500 nm. When the thicknesses of the mesh lines are less than about 100 nm, the electrode resistance may be increased so that the electrical property may be deteriorated. When the thicknesses of the mesh lines exceed about 500 nm, the entire thickness of a fingerprint sensor may be thickened and the process efficiency may be deteriorated. Preferably, the thicknesses of the mesh lines may be in the range of about 150 nm to about 200 nm. More preferably, the thicknesses of the mesh lines may be in the range of about 180 nm to about 200 nm.

In addition, the third width W3 may be larger than at least one of the first and second widths W1 and W2.

For example, the third width W3 may be equal to or less than ten times of the first width W1. In detail, the third width W3 may be equal to or less than five times of the first width W1. In more detail, the third width W3 may be equal to or less than twice of the first width W1.

That is, the third width W3 may be larger than the first width W1 in the range.

In addition, the third width W3 may be equal to or less than ten times of the second width W2. In detail, the third width W3 may be equal to or less than five times of the second width W2. In more detail, the third width W3 may be equal to or less than twice of the second width W2.

That is, the third width W3 may be larger than the second width W2 in the above range.

The width of the cross area exceeds ten times of that of the first or second mesh line, the cross area may be viewed from an outside, so that the visibility of the touch window may be deteriorated. In addition, when the width of the cross area is less than that of the first or second mesh line, the cross area may be cracked due to static electricity (ESD), so that the visibility of a touch window may be deteriorated.

Figure 3:
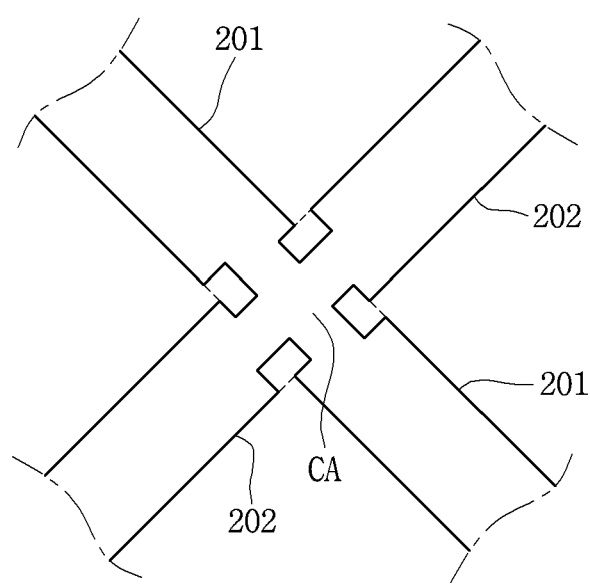
FIGS. 3 to 5 are enlarged views of a B region shown in FIG. 2.
Figure 4:
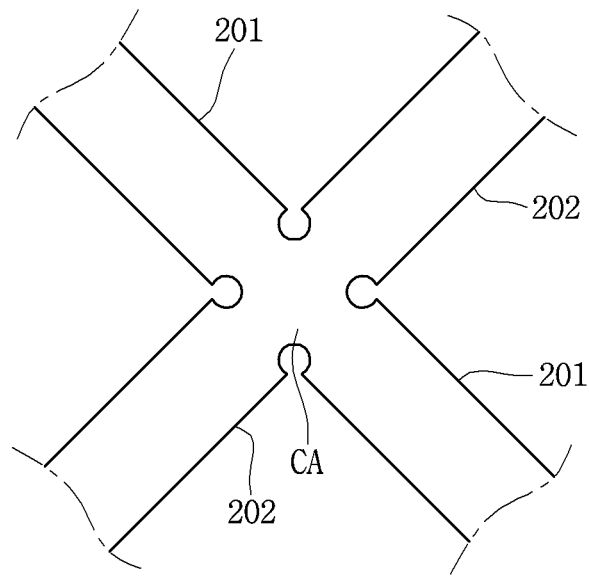
Figure 5:
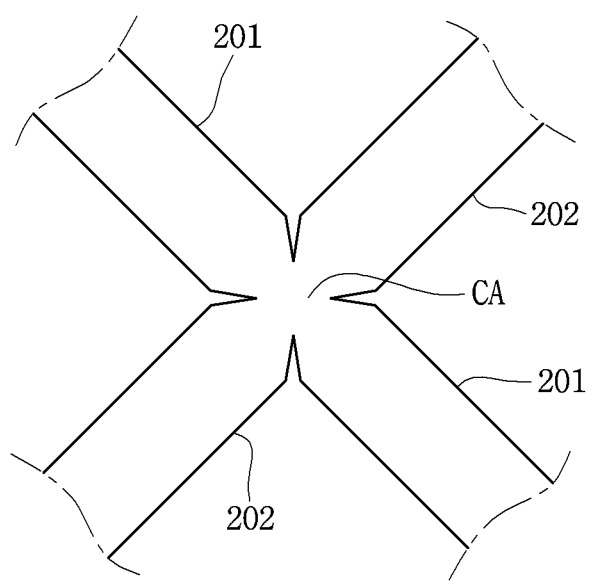

Referring to FIGS. 3 to 5, the width of the mesh line may be gradually narrowed as the mesh line extends toward the cross area.

For example, referring to FIG. 3, the width of at least one of the first and second mesh lines 201 and 202 may be gradually narrowed as the mesh line extends toward the cross area CA.

In detail, referring to FIG. 3, one end of at least one of the first and second mesh lines 201 and 202 may be narrowed at the cross area CA. That is, the one end of at least one of the first and second mesh lines 201 and 202 may be narrowed such that an area or a cross-sectional area of the cross area CA can be reduced.

Referring to FIG. 4, at least one of the first and second mesh lines 201 and 202 may have one end which is narrowed at the cross area CA.

For example, at least one of the first and second mesh lines 201 and 202 may have a curved end at the cross area CA to have a narrow width. That is, at least one of the first and second mesh lines 201 and 202 may have the curved end with a narrow width at the cross area CA such that an area or a cross-sectional area of the cross area CA can be reduced.

Referring to FIG. 5, at least one of the first and second mesh lines 201 and 202 may have one end which is narrowed at the cross area CA.

For example, at least one of the first and second mesh lines 201 and 202 may have one end which is angled at the cross area CA to have a narrow width. That is, at least one of the first and second mesh lines 201 and 202 may have one end which is angled to have the narrow width, such that an area or a cross-sectional area of the cross area CA can be reduced. Thus, at least one of the first and second mesh lines 201 and 202 may have one end formed in a triangular shape.

As shown in FIGS. 3 to 5, since at least of the first and second mesh lines 201 and 202 has a width which is gradually narrowed as extending toward the cross area CA, the area or cross-sectional area of the cross area CA may be reduced. e The cross area CA, in which the first and second mesh lines cross each other, may have a width and an area larger than those of the first and second mesh lines. Thus, the sheet resistance of the cross area and the mesh lines are not uniform, so that the overall efficiency may be deteriorated.

Therefore, the mesh lines are prepared to have widths which are gradually narrowed toward the cross area, so that the width of the cross area larger than those of the mesh lines when the first and second mesh lines are prepared may be offset.

Thus, by unifying the sheet resistance of the first and second mesh lines and the cross area, the efficiency of the touch window may be improved.

Figure 6:
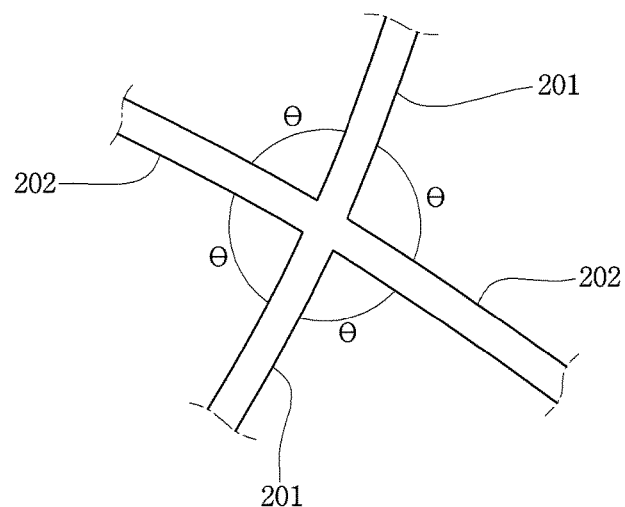
FIG. 6 is an enlarged view of a C region shown in FIG. 1.

Referring to FIG. 6, the angles between the mesh lines and the crossing area may be in a predetermined angle range.

For example, the first and second mesh lines 201 and 202 crossing each other may be disposed in the cross area CA at a predetermined angle. In detail, the cross angle θ between the first and second mesh lines 201 and 202 may be in the range of about 60° to about 120°.

As shown in FIG. 6, the cross angles θ, that is, the cross angles of four cross regions formed by allowing the first and second mesh lines 201 and 202 to cross each other may be in the range of about 60° to about 120°.

Thus, the four cross angles θ of the first and second mesh lines 201 and 202 include at least two obtuse angles and at least two acute angles.

When the cross angles θ between the first and second mesh lines 201 and 202 are less than about 60° or exceed about 120°, the width of the cross area, in which the first and second mesh lines overlap each other, is enlarged more those that of the first and/or second mesh lines, so that the sheet resistance may not be uniform and the visibility may be degraded.

Figure 7:
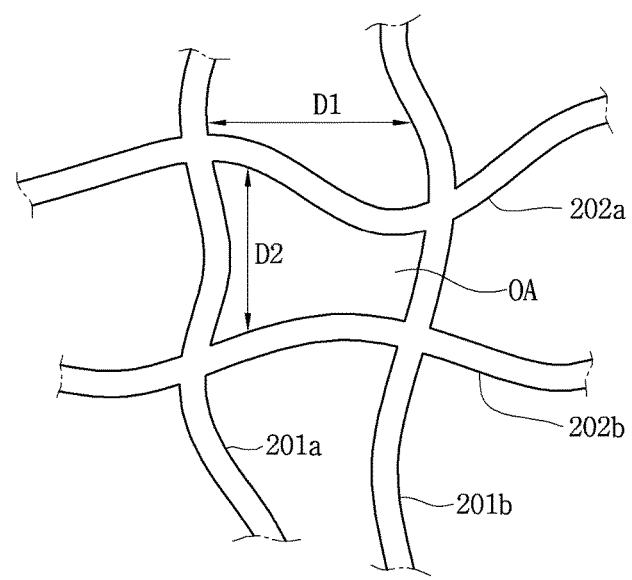
FIG. 7 is an enlarged view of a D region shown in FIG. 1.

Referring to FIG. 7, at least one of the first and second mesh lines 201 and 202 may include a linear or curved line.

For example, the plurality of first mesh lines 201 extending in the first direction may include curved or linear lines, and the plurality of second mesh lines 202 extending in a direction different from the first direction may include curved and/or linear lines.

The first mesh line 201 may include first and second sub-mesh lines 201a and 201b. For example, the first mesh line 201 may include the first and second sub-mesh lines 201a and 201b spaced apart from each other by a first interval distance D1.

In addition, the second mesh line 202 may include third and fourth sub-mesh lines 202a and 202b. For example, the second mesh line 202 may include the third and fourth sub-mesh lines 202a and 202b spaced apart from each other by a second interval distance D2.

At least one of the first and second sub-mesh lines 201a and 201b may include a linear or curved line. In addition, the first interval distance D1 between the first and second sub-mesh lines 201a and 201b may vary in the first direction.

At least one of the third and fourth sub-mesh lines 202a and 202b may include a linear or curved line. In addition, the second interval distance D2 between the third and fourth sub-mesh lines 202a and 202b may vary in the second direction.

For example, the first interval distance D1 may increase in the first direction and the second interval distance D2 may increase in the second direction. Alternatively, the first interval distance D1 may increase in the first direction and the second interval distance D2 may decrease in the second direction. Alternatively, the first interval distance D1 may decrease in the first direction and the second interval distance D2 may increase in the second direction. Alternatively, the first interval distance D1 may decrease in the first direction and the second interval distance D2 may decrease in the second direction.

Alternatively, the first interval distance D1 may randomly vary in the first direction and the second interval distance D2 may randomly vary in the second direction.

The sensing electrode 200 may include the first and second mesh lines 201 and 202 crossing each other. Thus, an area, that is, an opening part OA, in which any mesh lines do not exist on the substrate, may be formed.

The opening part OA may be formed in various shapes. For example, the opening part OA may have various shapes such as a polygonal shape including a rectangular shape, a diamond shape, a pentagon shape or a hexagonal shape, or a circular shape.

The opening part OA may have a random shape. For example, since the first and second interval distances D1 and D2 vary in the first and second directions, respectively, the opening parts OA formed by the mesh lines may have mutually different shapes due to the difference between the first and second interval distances D1 and D2.

That is, the mesh line including the first and second mesh lines may extend randomly in the form of a curved line or a linear line, and each of the opening parts formed by the first and second mesh lines may be formed in a random shape.

The width of the cross area in which the mesh lines cross each other and the width of the mesh lines may be uniformly controlled according to the random extension of the mesh line and the shape of the opening part Thus, degradation in the efficiency and visibility caused by the non-uniform widths may be prevented.

The wire electrode 300 may be disposed on the substrate 100. For example, the wire electrode 300 may be disposed on at least one of the active area AA and the unactive area UA of the substrate 100. In detail, the wire electrode 300 may be disposed on the unactive area UA of the substrate 100.

In addition, the wire electrode 300 may be connected to the sensing electrode 200. For example, one end of the wire electrode 300 may be connected to the sensing electrode 200 and the opposite end may be connected to a printed circuit board (not shown) disposed on the unactive area UA.

Thus, the sensed touch signal from the sensing electrode may be transferred through the wire electrode to the printed circuit board on which a driving chip is mounted and then, may be transferred to a main board chip through the driving chip, so that a touch operation may be performed.

Although not shown in the drawings, an outer dummy layer may be further disposed on the unactive area UA of the substrate 100. In addition, the wire electrode 300 may be disposed on the outer dummy layer.

The outer dummy layer may allow the wire electrode disposed on the unactive area and the printed circuit board connecting the wire electrode to an external circuit not to be viewed from an outside.

The outer dummy layer may have a color suitable for a desired outer appearance thereof. For example, the outer dummy layer may include a black or white pigment to have a black or white color. Alternatively, various colors such as red or blue may be shown by using various color films.

When the outer dummy layer is formed using a color film, the outer dummy layer may be easily formed on a flexible substrate.

In addition, a desired logo may be formed in the outer dummy layer through various schemes. The outer dummy layer may be formed through a deposition, print, or wet coating scheme.

The outer dummy layer may include at least one layer. For example, the outer dummy layer may consist of one layer or at least two layers having mutually different widths.

The wire electrode 300 may include a conductive material. For example, the wire electrode 300 may include a material the same as or similar to that of the sensing electrode 200.

In addition, the wire electrode 300 may include a plurality of mesh lines which cross each other to be formed in a mesh shape. Since the mesh lines of the wire electrode 300 is identical or similar to the mesh lines of the sensing electrode, the details will be omitted.

Hereinafter, touch windows of various embodiments according to a disposing position of an electrode will be described with reference to FIGS. 8 to 12.

Figure 8:
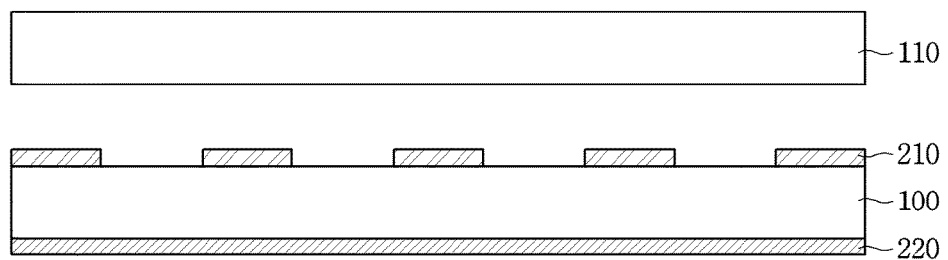
FIGS. 8 to 15 are views to explain various types of touch windows according to the first embodiment.

Referring to FIG. 8, a touch window according to an embodiment may include a cover substrate 110 and a substrate 100.

The cover substrate 110 may be disposed on the substrate 100. The cover substrate 110 may include a material the same as or similar to that of the substrate 100.

The cover substrate 110 and the substrate 100 may be combined with each other. For example, a transparent adhesive layer, for example, optical clear adhesive (OCA) may be interposed between the cover substrate 110 and the substrate 100, such that the cover substrate 110 and the substrate 100 may be combined with each other.

A sensing electrode may be disposed on the substrate 100. For example, first and second sensing electrodes 210 and 220 extending in mutually different directions may be disposed on the active area of the substrate 100. The first and second sensing electrodes 210 and 220 may be directly disposed on the substrate 100, or may be disposed on a resin layer after the resin layer is disposed on the substrate 100.

In detail, the first sensing electrode 210 extending in one direction may be disposed on one surface of the substrate 100, and the second sensing electrode 220 extending in a direction different from that of the first sensing electrode 210, that is, the one direction may be disposed on the opposite surface of the substrate 100.

In addition, a wire electrode connected to the first and second sensing electrodes 210 and 220 may be disposed on the unactive area of the substrate 100.

The first and second sensing electrodes 210 and 220 and the wire electrode may include a plurality of mesh lines crossing each other. Since the mesh lines are identical or similar to those described above, the details will be omitted.

Figure 9:
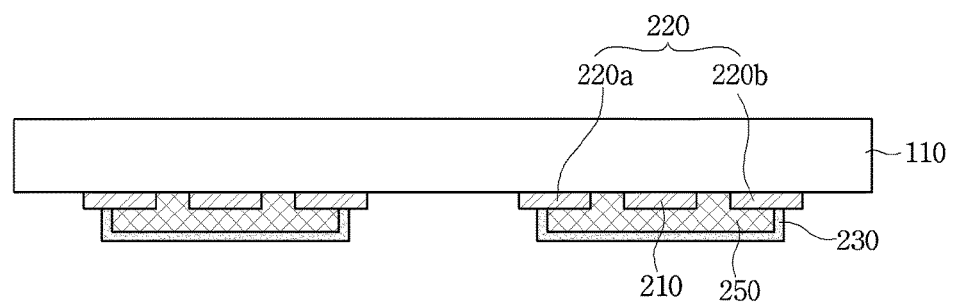
Figure 10:
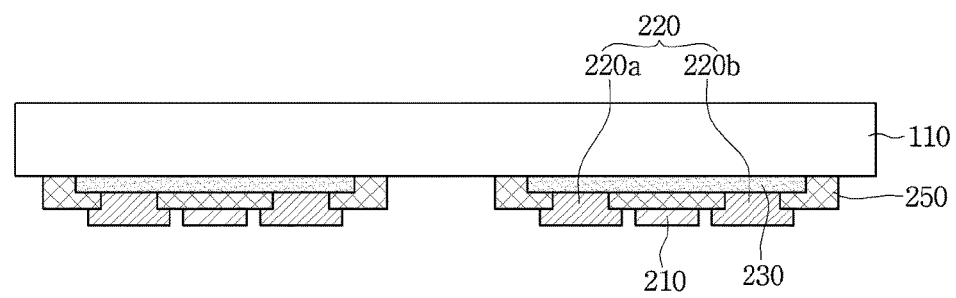

Referring to FIGS. 9 and 10, a touch window according to an embodiment may include a cover substrate 110.

The cover substrate 110 may include a material the same as or similar to that of the substrate 100 described above.

A sensing electrode may be disposed on the cover substrate 110. For example, first and second sensing electrodes 210 and 220 extending in mutually different directions may be disposed on the active area of the cover substrate 110. The first and second sensing electrodes 210 and 220 may be directly disposed on the substrate 100, or may be disposed on another layer such as a resin layer or an index matching layer after the layer is disposed on the substrate 100.

In detail, the first sensing electrode 210 extending in one direction may be disposed on one surface of the cover substrate 110, and the second sensing electrode 220 extending in a direction different from that of the first sensing electrode 210, that is, the one direction may be disposed on one surface of the cover substrate 110. That is, the first and second sensing electrodes 210 and 220 may be disposed the same surface of the cover substrate 110.

For example, referring to FIG. 9, the first sensing electrode 210 extending in one direction and second unit sensing electrodes 220a and 220b spaced apart from the first sensing electrode 210, respectively may be disposed on the cover substrate 110, and an insulating layer 250 may be disposed on the first sensing electrode 210 and the second unit sensing electrodes 220a and 220b. In this case, the insulating layer 250 may be partially disposed on the second unit sensing electrodes 220a and 220b, or a hole may be formed on the insulating layer 250 to expose the second unit sensing electrodes 220a and 220b.

Then, a bridge electrode 230 may be disposed on the insulating layer 250 to allow the exposed surfaces of the second unit sensing electrodes 220a and 220b to be connected to each other, so that the second unit sensing electrodes 220a and 220b may be connected to each other in a direction different from the one direction.

Alternatively, referring to FIG. 10, a plurality of bridge electrodes 230 spaced apart from each other may be disposed on the cover substrate 110 and an insulating layer 250 may be disposed on the bridge electrodes 230. In this case, the insulating layer 250 may be disposed while surrounding the bridge electrode 230 and a hole may be formed thereon, or may be disposed while partially surrounding the bridge electrode 230, so that the bridge electrode 230 may be exposed.

Then, the first sensing electrode 210 and the second unit sensing electrodes 220a and 220b may be disposed on the insulating layer 250. For example, the first sensing electrode 210 may be disposed on the insulating layer 250 and the second unit sensing electrodes 220a and 220b may make contact with the exposed bridge electrode 230. Thus, the first sensing electrode 210 may extend in one direction and the second sensing electrodes 220 may be connected to each other in a direction different from the one direction.

In addition, a wire electrode connected to the first and second sensing electrodes 210 and 220 may be disposed on the unactive area of the cover substrate 110.

The first and second sensing electrodes 210 and 220 and the wire electrode may include a plurality of mesh lines crossing each other. Since the mesh lines are identical or similar to those described above, the details will be omitted.

Figure 11:
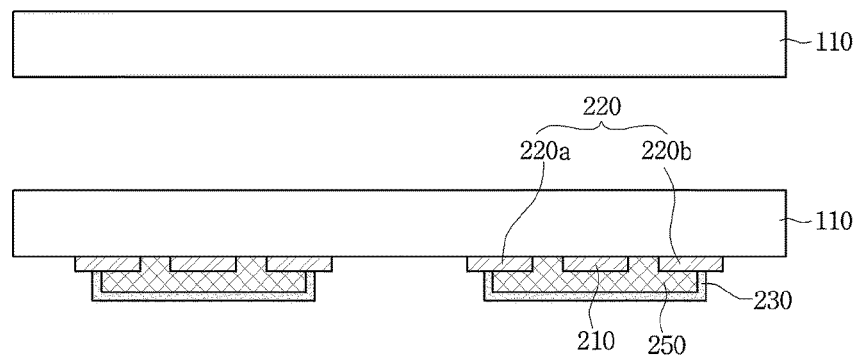
Figure 12:
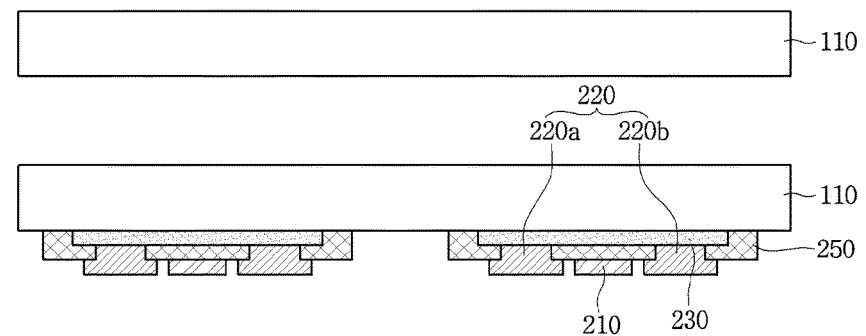

Referring to FIGS. 11 and 12, a touch window according to an embodiment may include a cover substrate 110 and a substrate 100.

The cover substrate 110 may be disposed on the substrate 100. The cover substrate 110 may include a material the same as or similar to that of the substrate 100.

The cover substrate 110 and the substrate 100 may be combined with each other. For example, a transparent adhesive layer, for example, optical clear adhesive (OCA) may be interposed between the cover substrate 110 and the substrate 100, such that the cover substrate 110 and the substrate 100 may be combined with each other.

A sensing electrode may be disposed on the substrate 100. For example, first and second sensing electrodes 210 and 220 extending in mutually different directions may be disposed on the active area of the substrate 100. The first and second sensing electrodes 210 and 220 may be directly disposed on the substrate 100, or may be disposed on a resin layer after the resin layer is disposed on the substrate 100.

In detail, the first sensing electrode 210 extending in one direction may be disposed on one surface of the substrate 100, and the second sensing electrode 220 extending in a direction different from that of the first sensing electrode 210, that is, the one direction may be disposed on one surface of the substrate 100. That is, the first and second sensing electrodes 210 and 220 may be disposed the same surface of the substrate.

Since the dispositions of the first and second sensing electrodes 210 and 220 are the same as or similar to those in FIGS. 9 and 10 described above, the details will be omitted.

In addition, a wire electrode connected to the first and second sensing electrodes 210 and 220 may be disposed on the unactive area of the substrate 100.

The first and second sensing electrodes 210 and 220 and the wire electrode may include a plurality of mesh lines crossing each other. Since the mesh lines are identical or similar to those described above, the details will be omitted.

Figure 13:
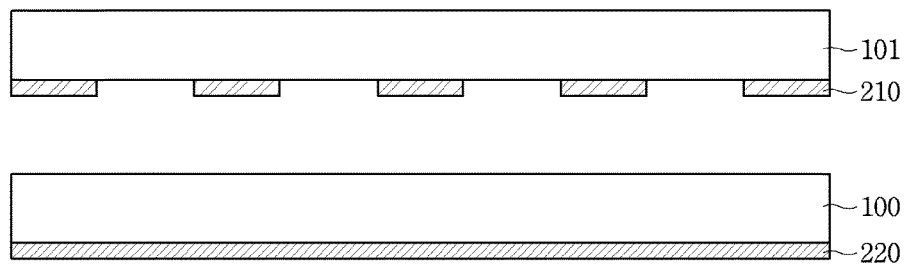

Referring to FIG. 13, a touch window according to an embodiment may include a cover substrate 110 and a substrate 100.

The cover substrate 110 may be disposed on the substrate 100. The cover substrate 110 may include a material the same as or similar to that of the substrate 100 described above.

The cover substrate 110 and the substrate 100 may be combined with each other. For example, a transparent adhesive layer, for example, optical clear adhesive (OCA) may be interposed between the cover substrate 110 and the substrate 100, such that the cover substrate 110 and the substrate 100 may be combined with each other.

A sensing electrode may be disposed on the cover substrate 110 and the substrate 100. For example, the first sensing electrode 210 may be disposed on the active area of the cover substrate 110 and the second sensing electrode 220 may be disposed on the active area of the substrate 100. The first and second sensing electrodes 210 and 220 may be directly disposed on the cover substrate 110 and the substrate 100, or may be disposed on a resin layer after the resin layer is disposed on the cover substrate 110 and the substrate 100.

In detail, the first sensing electrode 210 extending in one direction may be disposed on one surface of the cover substrate 110, and the second sensing electrode 220 extending in a direction different from that of the first sensing electrode 210, that is, the one direction may be disposed on one surface of the substrate 100.

In addition, a wire electrode connected to the first and second sensing electrodes 210 and 220, respectively may be disposed on the unactive areas of the cover substrate 110 and the substrate 100.

The first and second sensing electrodes 210 and 220 and the wire electrode may include a plurality of mesh lines crossing each other. Since the mesh lines are identical or similar to those described above, the details will be omitted.

Figure 14:
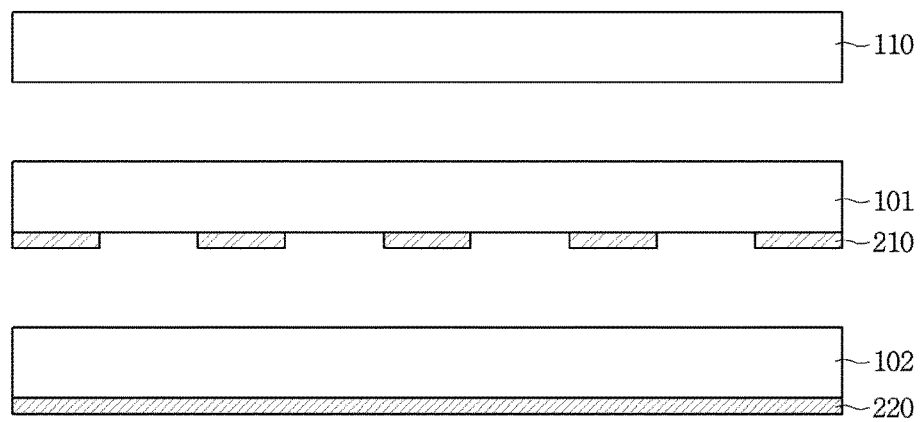

Referring to FIG. 14, a touch window according to an embodiment may include a cover substrate 110 and first and second substrates 101 and 102.

The cover substrate 110 may be disposed on the first substrate 101. The first substrate 101 may be disposed on the second substrate 102. That is, the cover substrate 110 and the first and second substrates 101 and 102 may be sequentially disposed.

The cover substrate 110 may include a material the same as or similar to that of the substrate 100 described above.

The cover substrate 110 and the first and second substrates 101 and 102 may be combined with each other. For example, transparent adhesive layers, for example, optical clear adhesive (OCA) may be interposed between the cover substrate 110 and the first substrate 101 and between the first and second substrates 101 and 102, such that the cover substrate 110 and the first and second substrate 101 and 102 may be combined with each other.

A sensing electrode may be disposed on the first and second substrates 101 and 102. For example, a first sensing electrode 210 may be disposed on the active area of the first substrate 101. A second sensing electrode 220 may be disposed on the active area of the second substrate 102.

In detail, the first sensing electrode 210 extending in one direction may be disposed on one surface of the first substrate 101, and the second sensing electrode 220 extending in a direction different from that of the first sensing electrode 210, that is, the one direction may be disposed on one surface of the second substrate 102. The first and second sensing electrodes 210 and 220 may be directly disposed on the first and second substrates 101 and 102, or may be disposed on a resin layer after the resin layer is disposed on the first and second substrates 101 and 102.

In addition, a wire electrode connected to the first and second sensing electrodes 210 and 220, respectively may be disposed on the unactive areas of the first and second substrates 101 and 102.

The first and second sensing electrodes 210 and 220 and the wire electrode may include a plurality of mesh lines crossing each other. Since the mesh lines are identical or similar to those described above, the details will be omitted.

Figure 15:
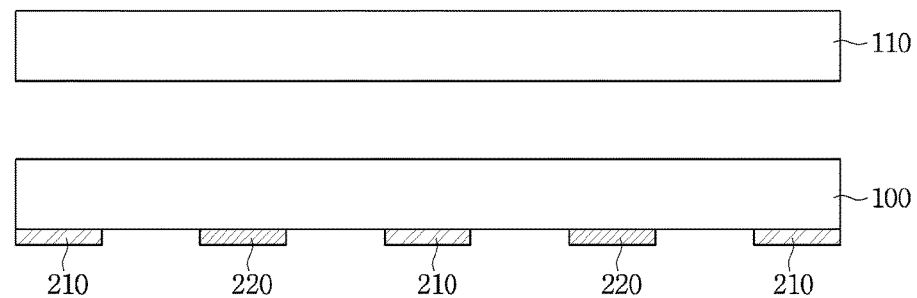

Referring to FIG. 15, a touch window according to an embodiment may include a cover substrate 110 and a substrate 100.

The cover substrate 110 may be disposed on the substrate 100. The cover substrate 110 may include a material the same as or similar to that of the substrate 100 described above.

The cover substrate 110 and the substrate 100 may be combined with each other. For example, a transparent adhesive layer, for example, optical clear adhesive (OCA) may be interposed between the cover substrate 110 and the substrate 100, such that the cover substrate 110 and the substrate 100 may be combined with each other.

A sensing electrode may be disposed on the substrate 100. For example, first and second sensing electrodes 210 and 220 extending in mutually different directions may be disposed on the active area of the substrate 100. The first and second sensing electrodes 210 and 220 may be directly or indirectly disposed on the substrate 100.

In detail, the first sensing electrode 210 extending in one direction may be disposed on one surface of the substrate 100, and the second sensing electrode 220 extending in a direction different from that of the first sensing electrode 210, that is, the one direction may be disposed on one surface of the substrate 100. That is, the first and second sensing electrodes 210 and 220 may be disposed the same surface of the substrate.

The first and second sensing electrodes 210 and 220 may be disposed on the substrate 100 while being spaced apart from each other. Thus, only the sensing electrodes may be disposed on the substrate without any additional insulating layers and bridge electrodes as shown in FIGS. 9 and 11.

In addition, a wire electrode connected to the first and second sensing electrodes 210 and 220, respectively may be disposed on the unactive area of the substrate 100.

The first and second sensing electrodes 210 and 220 and the wire electrode may include a plurality of mesh lines crossing each other. Since the mesh lines are identical or similar to those described above, the details will be omitted.

Hereinafter, a touch window according to the second embodiment will be described with reference to FIGS. 16 to 26. In the following description about the touch window according to the second embodiment, the description about the parts similar or identical to those of the touch window according to the first embodiment previously described will be omitted. In addition, in the following description about the touch window according to the second embodiment, the same reference numbers will be assigned to the same elements as those of the touch window according to the first embodiment.

Figure 16:
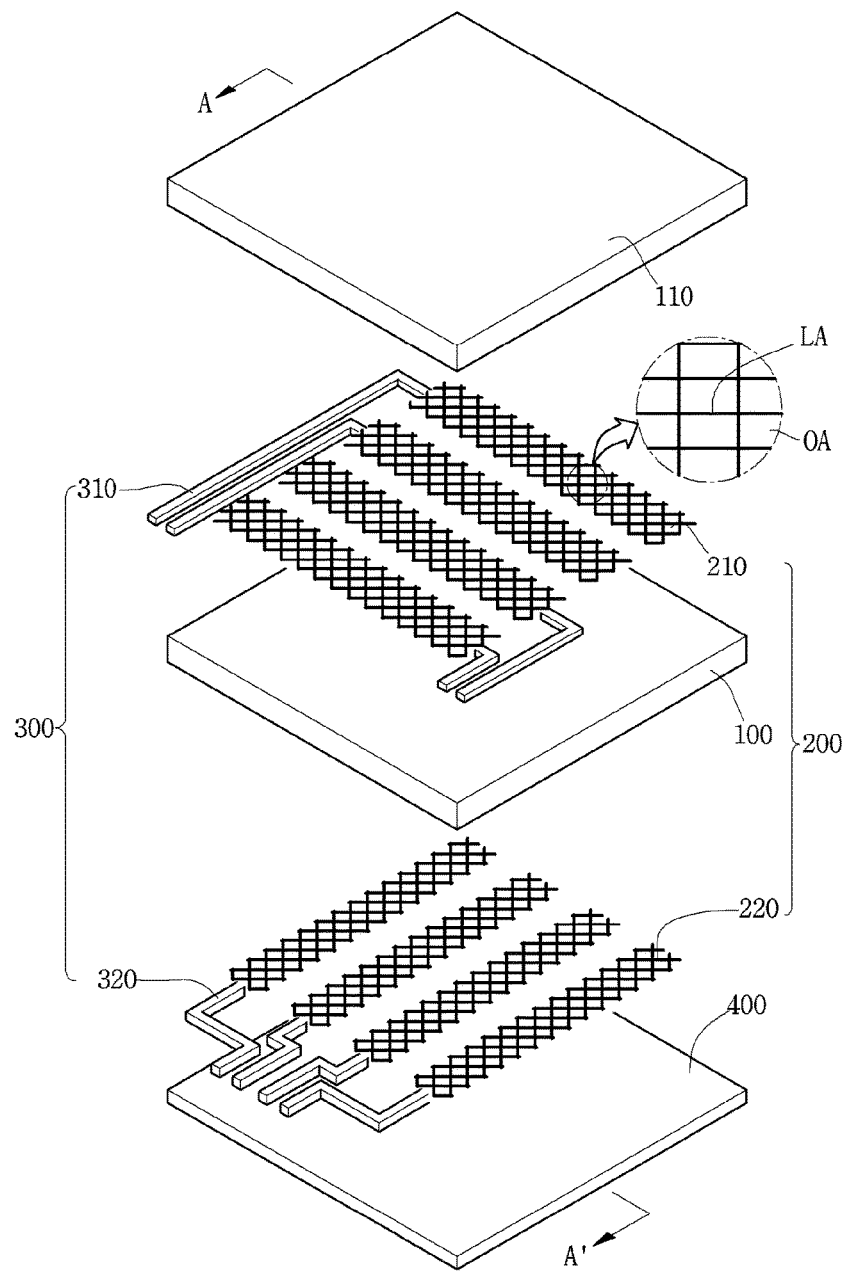
FIG. 16 is a perspective view showing a touch window according to the second embodiment.

Referring to FIG. 16, the touch window according to the second embodiment may include an electrode layer including a cover substrate 110, a substrate 100, a sensing electrode 200 and a wire electrode 300 and a protective layer 400.

The cover substrate 110 may support the sensing electrode 200, the wire electrode 300 and the protective layer 400.

The cover substrate 110 may be combined with the substrate 100. An adhesive layer may be interposed between the cover substrate 110 and the substrate 100, such that the cover substrate 110 and the substrate 100 may be combined with each other through the adhesive layer.

The substrate 100 may be disposed on the cover substrate 110. The substrate 100 may support the sensing electrode 200, the wire electrode 300 and the protective layer 400. That is, the substrate 100 may serve as a support substrate for supporting the sensing electrode 200, the wire electrode 300 and the protective layer 400.

The sensing electrode 200 and the wire electrode 300 may be disposed on the substrate 100. For example, the sensing electrode 200 and the wire electrode 300 may be disposed on at least one of both surfaces of the substrate 100 opposite to each other.

Figure 17:
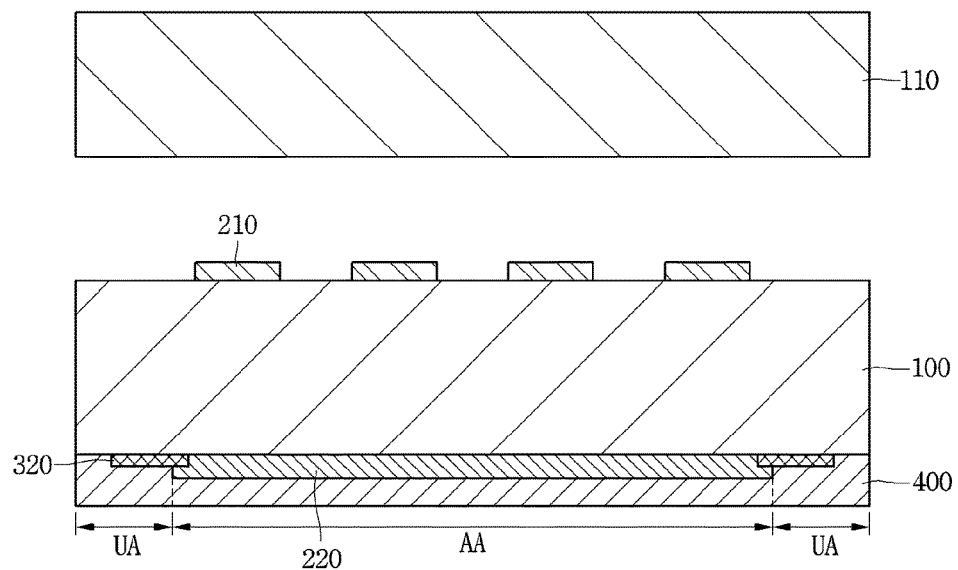
FIGS. 17 and 18 are sectional views taken along line A-A' of FIG. 16.
Figure 18:
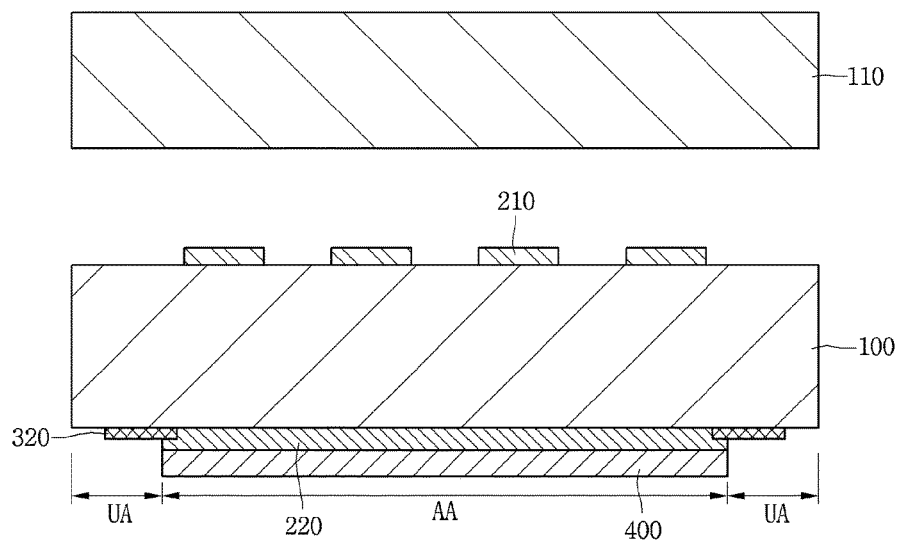

Referring to FIGS. 16 to 18, the sensing electrode 200 may be disposed on one surface of the substrate 100 and the opposite surface.

The sensing electrode 200 may be disposed on at least one of the active and unactive areas of the substrate 100.

The sensing electrode 200 may include first and second sensing electrodes 210 and 220. For example, the sensing electrode 200 may include the first sensing electrode 210 which is disposed on one surface of the substrate 100 and extends in the first direction and the second sensing electrode 220 which is disposed on the opposite surface of the substrate 100 and extends in a direction different from the first direction.

That is, the first and second sensing electrodes 210 and 220 may be disposed on both surfaces of the substrate 100, respectively. Thus, since the first and second sensing electrodes 210 and 220 all may be disposed on one substrate 100, the thickness of a touch window may be reduced.

The wire electrode 300 may be disposed on the unactive area UA of the substrate 100. The wire electrode 300 may be disposed on the unactive area UA of the substrate 100 and connected to the sensing electrode 200.

The wire electrode 300 may include first and second wire electrodes 310 and 320. For example, the wire electrode 300 may include the first wire electrode 310 connected to the first sensing electrode 210 and the second wire electrode 320 connected to the second sensing electrode 220.

The first and second wire electrodes 310 and 320 may be disposed on both surfaces of the substrate, that is, one surface and the opposite surface thereof.

In addition, since it is possible to pattern the sensing electrode and the wire electrode on the one surface and the opposite surface of the substrate at once, the first and second sensing electrodes and the first and second wire electrodes may be formed of the same material at the same time. Thus, the efficiency of the electrode patterning process may be improved and any aberration corrections for the patterning tolerance may not be required, so that the yield may be improved.

The touch signal generated from the sensing electrode 200 may be transferred through the wire electrode 300 to a driving chip of a printed circuit board (not shown). Thus, the driving chip may transfer the signal to a main board chip, so that a touch operation may be performed.

The protective layer 400 may be disposed on the substrate 100. For example, the protective layer 400 may be disposed on at least one of one surface and the opposite surface of the substrate 100. In detail, the protective layer 400 may be disposed on one surface of the substrate 100 or the opposite surface.

For example, the protective layer 400 may be disposed on the opposite surface of the substrate 100 on which the second sensing electrode 220 is disposed. That is, the protective layer 400 may be disposed on the surface opposite to the one surface of the substrate which faces the cover substrate 110.

In addition, the protective layer 400 may be disposed on the entire surface or a partial surface of the substrate 100. For example, the protective layer 300 may be disposed on at least one of the active and unactive areas AA and UA of the substrate 100. In detail, the protective layer 400 may be disposed on all the active and unactive areas AA and UA as shown in FIG. 2, or only the active area AA as shown in FIG. 18.

The protective layer 400 may disposed on the substrate 100 while surrounding at least one of the sensing electrode 200 and the wire electrode 300.

In detail, when the protective layer 400 is disposed on all the active and unactive areas AA and UA as shown in FIG. 17, the protective layer 400 may be disposed on the substrate 100 while surrounding both the sensing electrode 200 and the wire electrode 300. When the protective layer 400 is disposed on only the active area AA as shown in FIG. 18, the protective layer 400 may be disposed on the substrate 100 while surrounding only the sensing electrode 200.

In addition, the protective layer 400 may make contact with at least one of the sensing electrode 200 and the wire electrode 300. For example, as shown in FIGS. 17 and 18, the protective layer 400 may make direct contact with at least one of the sensing electrode 200 and the wire electrode 300.

The protective layer 400 may include resin. For example, the protective layer 400 may be formed by printing a resin composition on the substrate 100.

The protective layer 400 may include an adhesive material. That is, the substrate may adhere to another substrate through the protective layer 300.

In addition, the protective layer 300 may include at least one of acrylic based resin composition, silicon based resin composition and urethane based resin composition.

The protective layer 400 may serve as an adhesive layer for another member or an electrode protective layer on the substrate 100. That is, one protective layer 400 may have various functions.

Thus, according to the touch window of the embodiment, due to the protective layer prepared as a single-layer and having various functions, the reliability of the touch window may be improved and the thickness of the touch window may be reduced so that a slimmer touch window may be implemented.

The protective layer 400 may be provided at a thin thickness. For example, the protective layer 400 may have a thickness of about 30 µm or less. In detail, the protective layer 400 may have a thickness in the range of about 2 µm to about 30 µm. In detail, the protective layer 400 may have a thickness in the range of about 2 µm to about 20 µm.

When the thickness of the protective layer 40 exceeds about 30 µm, the entire thickness of the touch window may be increased due to the protective layer 400. When the thickness of the protective layer 40 is less than about 2 µm, the coating quality of the protective layer may be deteriorated and the process efficiency may be deteriorated.

The touch window according to the second embodiment may include resin composition and a protective layer having a thin thickness and disposed on an electrode layer.

In addition, the resin composition may have an adhesive property and an anti-scattering function. Further, acrylic based resin, silicon based resin and urethane based resin have good durability, so that the electrode layer may be prevented from being cracking or short-circuited due to an external shock by the protective layer that surrounds the electrode layer.

In addition, the anti-scattering, adhesion and electrode protection all may be implemented by the protective layer at once without the need to dispose each functional layer, so that the thickness of the touch window may be reduced.

Thus, the touch window according to an embodiment may have improved reliability and a thin thickness due to the protective layer.

Hereinafter, a touch window according to another second embodiment will be described with reference to FIGS. 19 to 26 In the following description of the touch window according to another second embodiment, the description about the parts similar or identical to those of the second embodiment described above will be omitted.

Figure 19:
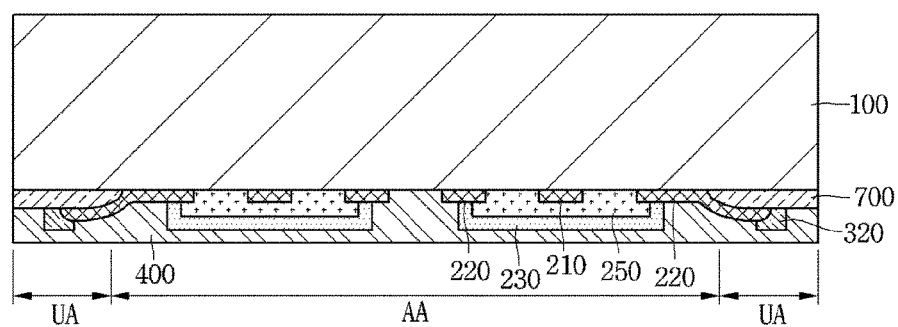
FIGS. 19 to 26 are sectional views showing another touch window according to the second embodiment.
Figure 20:
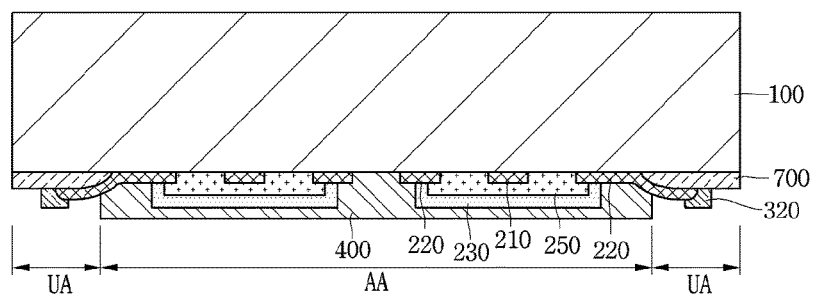

Referring to FIGS. 19 and 20, differently from the above-described embodiments, the touch window according to another second embodiment may include a sensing electrode disposed on one surface of the substrate 100.

For example, the first and second sensing electrodes 210 and 220 may be disposed the same surface of the substrate 100. In detail, the first and second sensing electrodes 210 and 220 may extend in mutually different directions on the same surface of the substrate 100.

In detail, referring to FIGS. 19 and 20, the first sensing electrodes 210 may be connected to each other and the second sensing electrode 220 may be connected to each other through a bridge electrode 230. For example, an insulating layer 250 may be disposed on the first and second sensing electrodes 210 and 220 while exposing the second sensing electrode 220. In addition, the bridge electrode 230 may be disposed on the insulating layer 250 such that the second sensing electrodes 220 are connected to each other.

Thus, the first and second sensing electrodes 210 and 220 may be insulated from each other and extend in mutually different directions on the same surface of the substrate 100.

The substrate 100 may be a cover substrate. That is, the first and second sensing electrodes 210 and 220 may be disposed on the same surface of the cover substrate.

In addition, an outer dummy layer 700 may be disposed on the unactive area UA of the substrate 100. The wire electrode 300 may be connected to the sensing electrode 200 and disposed on the outer dummy layer 700.

The protective layer 400 may be disposed on the substrate 100. For example, the protective layer 400 may be disposed on one surface of the substrate disposed on the sensing electrode and the wire electrode.

The protective layer 400 may be disposed on at least one of the active and unactive areas of the substrate 100.

Referring to FIG. 19, the protective layer 400 may be disposed on all the active and unactive areas AA and UA of the substrate 100. In detail, the protective layer 400 may surround the sensing electrode, the wire electrode and the outer dummy layer.

In addition, referring to FIG. 20, the protective layer 400 may be disposed only on the active area AA of the substrate 100. That is, the protective layer 400 may surround only the sensing electrode.

The protective layer 400 may have a thickness equal or similar to that of the outer dummy layer 700.

As the protective layer 400 is disposed on the entire surface of the substrate while surrounding the outer dummy layer or disposed only on the active area of the substrate at a thickness equal or similar to that of the outer dummy layer, the step difference between the cover substrate and the outer dummy layer may be relieved. Thus, when the touch window is bonded to another substrate, an adhesion error due to the step difference may be prevented, so that the reliability of the touch window may be improved.

In the following description, since the composition and thickness of the protective layer 400 are similar or identical to those of the embodiment described above, the details will be omitted.

Figure 21:
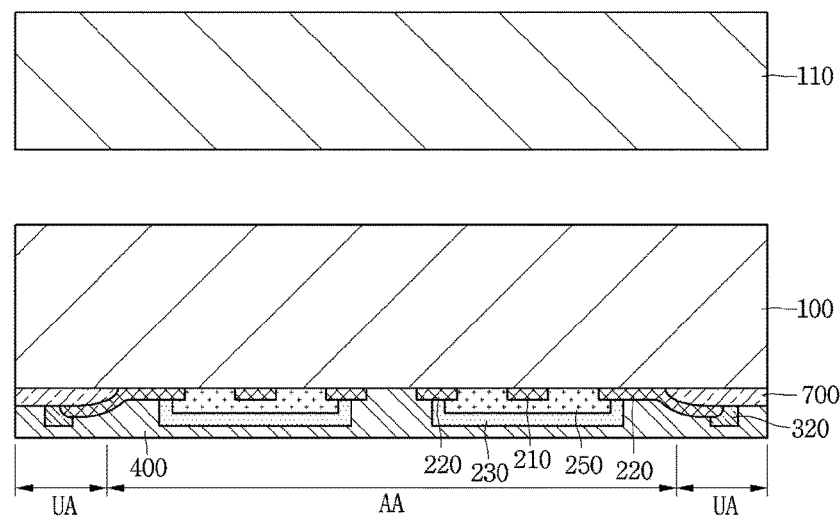
Figure 22:
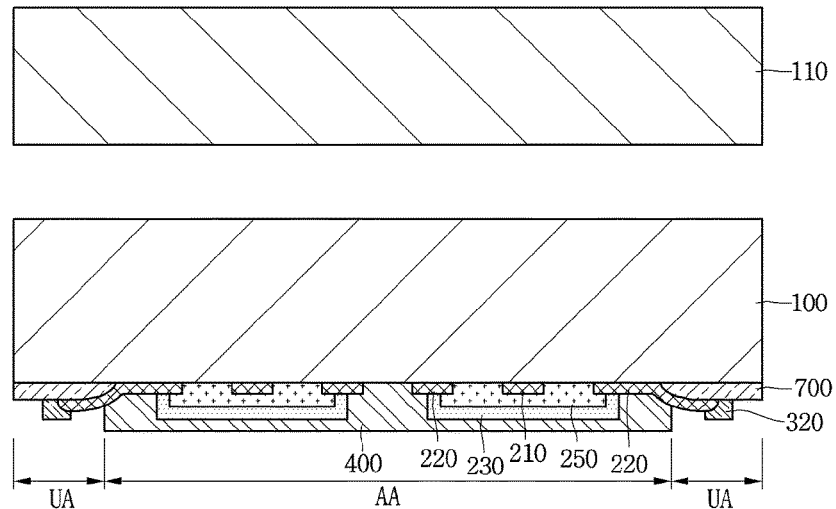

Referring to FIGS. 21 and 22, differently from the above-described embodiments, the touch window according to another embodiment may include a cover substrate 110 and an electrode layer disposed on one surface of the substrate 100.

In addition, an additional cover substrate 110 may be further disposed on the substrate 100. That is, according to the touch window of another embodiment, the substrate 100 may be disposed on the cover substrate 110 and the first and second sensing electrodes 210 and 220 may be disposed on the same surface of the substrate 100.

The protective layer 400 may be disposed on at least one of the active and unactive areas AA and UA of the substrate 100 while surrounding the sensing electrode and the wire electrode.

In the following description, the description of the composition and the thickness of the protective layer 400 similar or identical to those of the above-described embodiment will be omitted.

Figure 23:
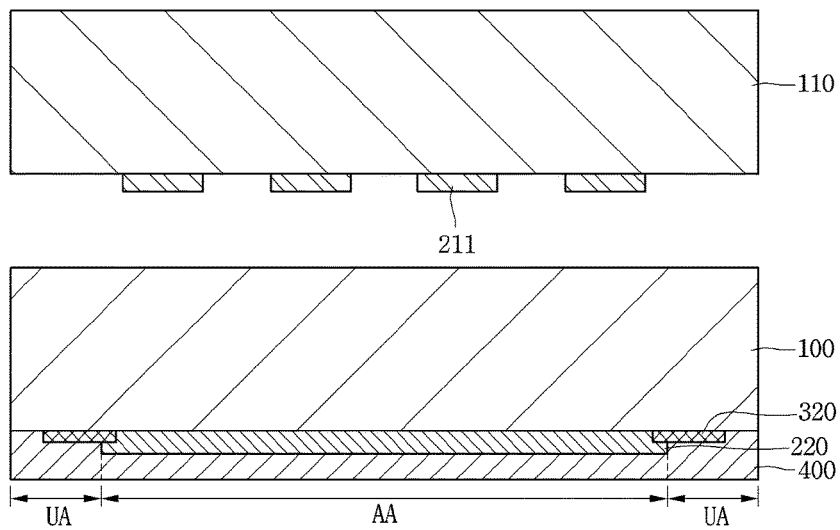
Figure 24:
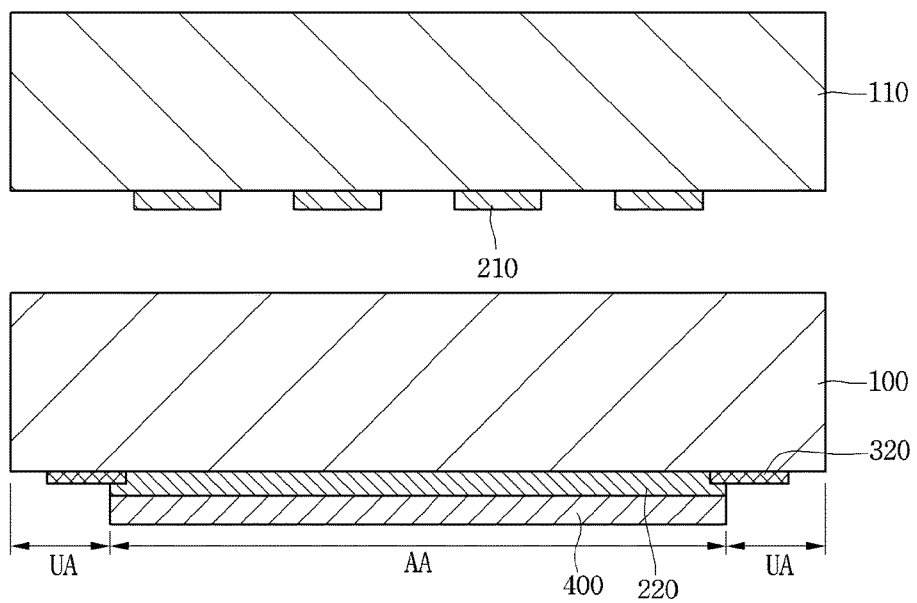

Referring to FIGS. 23 and 24, differently from the above-described embodiments, the touch window according to another embodiment may include a cover substrate 110 on the substrate 100 and an electrode layer disposed on one surfaces of the cover substrate 101 and the substrate 100.

For example, the touch window according to another embodiment may include the cover substrate 110 and the substrate 100, where the first sensing electrode 210 is disposed on one surface of the cover substrate 110 and the second sensing electrode 220 is disposed on one surface of the substrate 100.

In addition, the protective layer 400 may be disposed on one surface of the substrate 100. For example, the protective layer 400 may be disposed on the entire surface or a partial surface of the substrate 100 while surrounding the second sensing electrode 220 and the second wire electrode 320.

In the following description, the description of the composition and the thickness of the protective layer 400 similar or identical to those of the above-described embodiment will be omitted.

Figure 25:
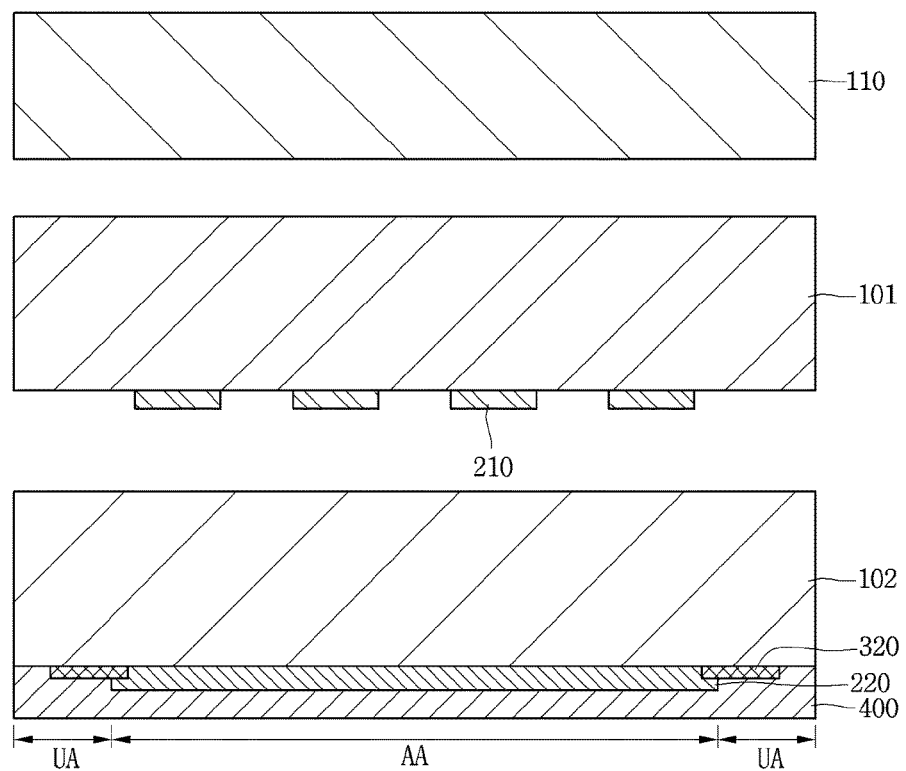
Figure 26:
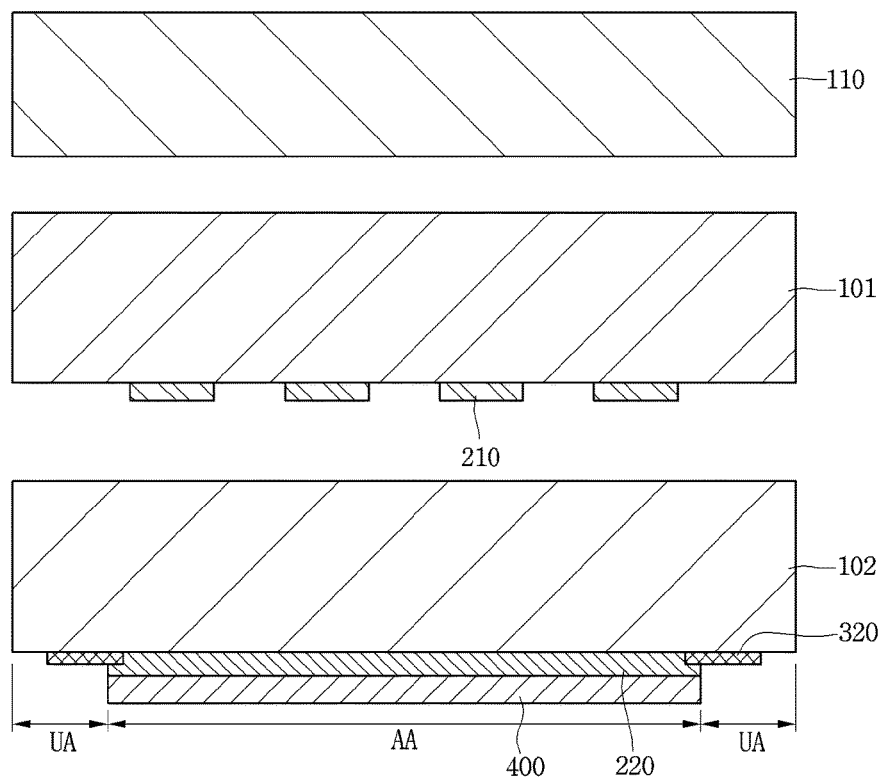

Referring to FIGS. 25 and 26, differently from the above-described embodiments, the touch window according to another embodiment may include a cover substrate 110 on the substrate 100. The substrate 100 may include the first substrate 101 on the cover substrate 110 and the second substrate on the first substrate 102.

The first sensing electrode 210 and the first wire electrode 310 may be disposed on one surface of the first substrate 101 and the second sensing electrode 220 and the second wire electrode 320 may be disposed on one surface of the second substrate 102.

In addition, the protective layer 400 may be disposed on one surface of the second substrate 102. For example, the protective layer 400 may be disposed on the entire surface or a partial surface of the second substrate 102 while surrounding the second sensing electrode 220 and the second wire electrode 320.

In the following description, the description of the composition and the thickness of the protective layer 400 similar or identical to those of the above-described embodiment will be omitted.

Hereinafter, a touch device, in which the touch window described above is coupled to a display panel, will be described with reference to FIGS. 27 to 30.

Figure 27:
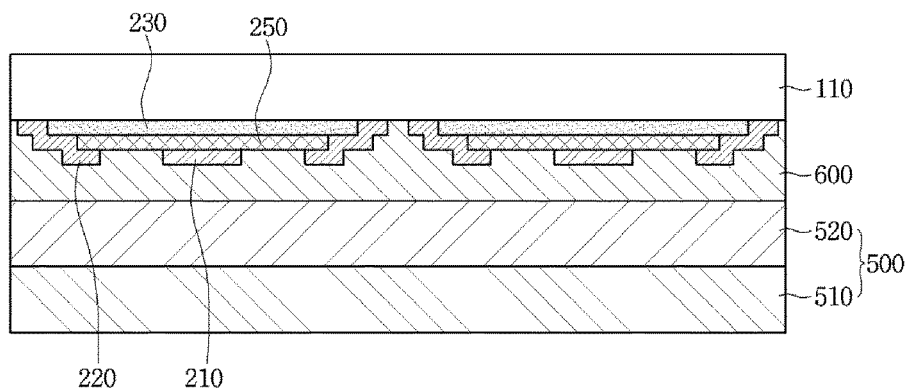
FIGS. 27 to 30 are views to explain a touch device including a touch window coupled with a display panel according to an embodiment.
Figure 28:
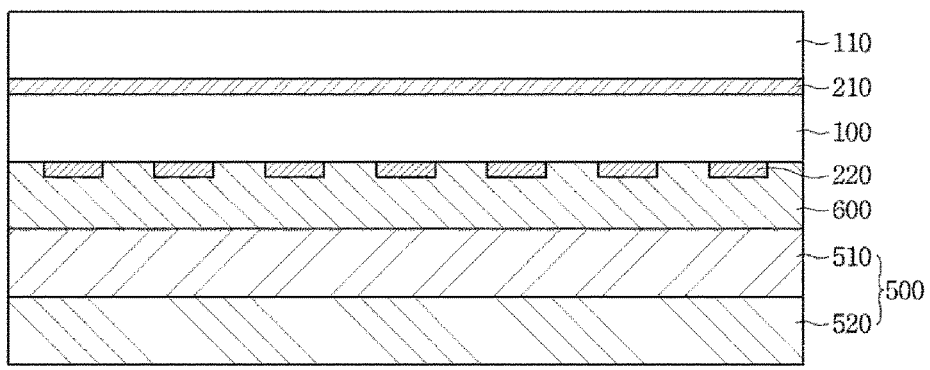

Referring to FIGS. 27 and 28, the touch device according to an embodiment may include the touch window disposed on the display panel 500.

In detail, referring to FIG. 27, the touch device may be formed by coupling the cover substrate 110 to the display panel 500. The cover substrate 110 and the display panel 500 may adhere to each other through an adhesive layer 600. For example, the cover substrate 110 may be combined with the display panel 500 through the adhesive layer 600 including optically clear adhesive (OCA).

Alternatively, referring to FIG. 28, when a substrate 100 is further disposed on the cover substrate 110, the touch device may be formed by coupling the substrate 100 to the display panel 500. The substrate 100 and the display panel 500 may adhere to each other through an adhesive layer 600. For example, the substrate 100 may be combined with the display panel 500 through the adhesive layer 600 including optically clear adhesive (OCA).

The display pane 500 may include third and fourth substrates 510 and 520.

If the display panel 500 is a liquid crystal display panel, the display panel 500 may have a structure in which the third substrate 510 including a thin film transistor (TFT) and a pixel electrode is combined with the fourth substrate 220 including color filter layers while a liquid crystal layer is interposed between the third and fourth substrates 510 and 520.

Further, the display panel 500 may be a liquid crystal display panel having a color filter on transistor (COT) structure formed by combining the third substrate 510 formed thereon with the TFT, a color filter, and a black matrix with the fourth substrate 520 while the liquid crystal layer is interposed between the third and fourth substrates 510 and 520. In other words, the TFT may be formed on the third substrate 510, a protective layer may be formed on the TFT, and the color filter layer may be formed on the protective layer. In addition, the pixel electrode, which makes contact with the TFT, is formed on the third substrate 510. In this case, to improve an aperture ratio and simplify a mask process, the black matrix may be omitted, and a common electrode may perform a function of the black matrix together with the inherent function thereof.

In addition, when the display panel 500 is a liquid crystal panel, the display device may further include a backlight unit for providing light at the back of the display panel 500.

When the display panel 600 is an organic light emitting device, the display panel 500 includes a self light-emitting device which does not require any additional light source. A thin film transistor is formed on the third substrate 510 of the display panel 500, and an organic light-emitting device (OLED) making contact with the thin film transistor is formed. The OLED may include an anode, a cathode and an organic light-emitting layer formed between the anode and the cathode. In addition, the display panel 500 may further include the fourth substrate 520, which performs the function of an encapsulation substrate for encapsulation, on the OLED.

Figure 29:
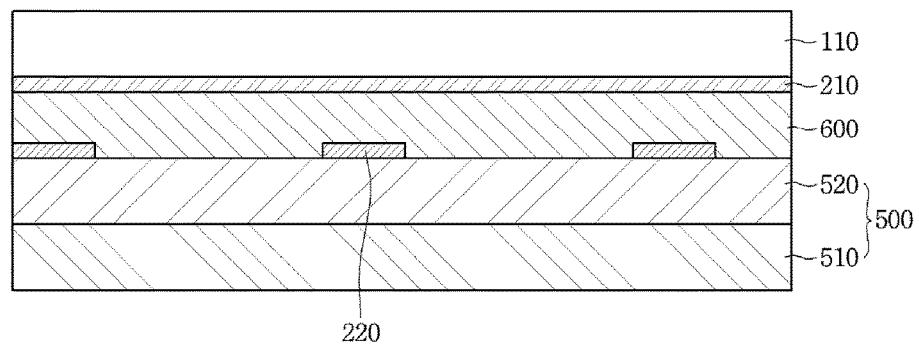

Referring to FIG. 29, a touch device according to an embodiment may include a touch panel formed integrally with the display panel 600. That is, a substrate supporting at least one sensing electrode may be omitted.

In detail, at least one sensing electrode may be disposed on at least one surface of the display panel 500. That is, at least one sensing electrode may be formed on at least one surface of the third and fourth substrate 510 or 520.

In this case, at least one sensing electrode may be formed on a top surface of the substrate disposed at an upper portion.

Referring to FIG. 29, the first sensing electrode 210 may disposed on one surface of the cover substrate 110. In addition, a first wire connected to the first sensing electrode 210 may be disposed. The second sensing electrode 220 may disposed on one surface of the display panel 500. In addition, a second wire connected to the second sensing electrode 220 may be disposed.

The adhesive layer 600 may be interposed between the cover substrate 110 and the display panel 500, such that the cover substrate and the display panel 500 may be combined with each other.

In addition, the cover substrate 110 may further include a polarizing plate below the cover substrate 110. The polarizing plate may be a linear polarizing plate or an anti-reflection polarizing plate. For example, when the display panel 500 is a liquid crystal display panel, the polarizing plate may be a linear polarizing plate. In addition, when the display panel 500 is an organic electroluminescent display panel, the polarizing plate may be an anti-reflection polarizing plate.

At least one substrate for supporting the sensing electrode may be omitted from the touch device according to an embodiment. For this reason, the touch device having a thin thickness and a light weight may be formed.

Hereinafter, a touch device according to another embodiment will be described with reference to FIG. 30. In the following description, the description overlapping with that of the above-described embodiments will be omitted. The same reference numerals will be assigned to the same elements.

Figure 30:
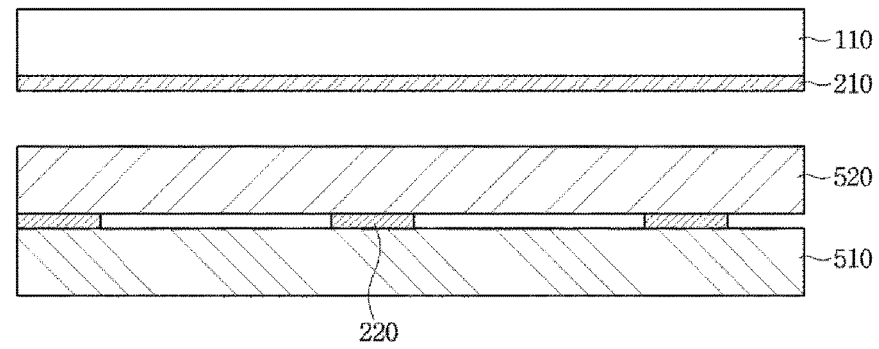

Referring to FIG. 30, a touch device according to an embodiment may include a touch panel integrated with the display panel 500. That is, the substrate for supporting at least one sensing electrode may be omitted.

For example, a sensing electrode, which serves as a sensor disposed in an active area to sense a touch, and a wire, through which an electrical signal is applied to the sensing electrode, may be formed inside the display panel. In detail, at least one sensing electrode or at least one wire may be disposed inside the display panel.

The display panel includes the third and fourth substrates 510 and 520. In this case, at least one of the first and second sensing electrodes 210 and 220 may be disposed between the third and fourth substrates 510 and 520. That is, at least one sensing electrode may be disposed on at least one surface of the third and fourth substrate 510 or 520.

Referring to FIG. 30, the first sensing electrode 210 may be disposed on one surface of the cover substrate 110. In addition, the first wire connected to the first sensing electrode 210 may be disposed. In addition, the second sensing electrode 220 and the second wire may be formed between the third and fourth substrates 510 and 520. That is, the second sensing electrode 220 and the second wire may be disposed inside the display panel and the first sensing electrode 210 and the first wire may be disposed outside the display panel.

The second sensing electrode 220 and the second wire may be disposed on the top surface of the third substrate 510 or the rear surface of the fourth substrate 520.

In addition, a polarizing plate may be further provided at a lower portion of the cover substrate 110.

When the display panel is a liquid crystal display panel and the second sensing electrode is formed on the top surface of the third substrate 510, the sensing electrode may be formed with a thin film transistor (TFT) or a pixel electrode. In addition, when the second sensing electrode is formed on the rear surface of the fourth substrate 520, a color filter layer may be formed on the sensing electrode or the sensing electrode may be formed on the color filter layer. When the display panel is an organic light emitting device and the second sensing electrode is formed on the top surface of the third substrate 510, the second sensing electrode may be formed with a thin film transistor or an organic light emitting device.

The touch device according to an embodiment may allow at least one substrate supporting a sensing electrode 300 to be omitted. For this reason, the touch device having a thin thickness and a light weight may be formed. In addition, the sensing electrode and the wire are formed with a device formed on the display panel, so that the process may be simplified and the cost may be reduced.

Hereinafter, one example of a display device, to which a touch window according to the embodiment described above is applied, will be described with reference to FIGS. 31 to 34.

Figure 31:
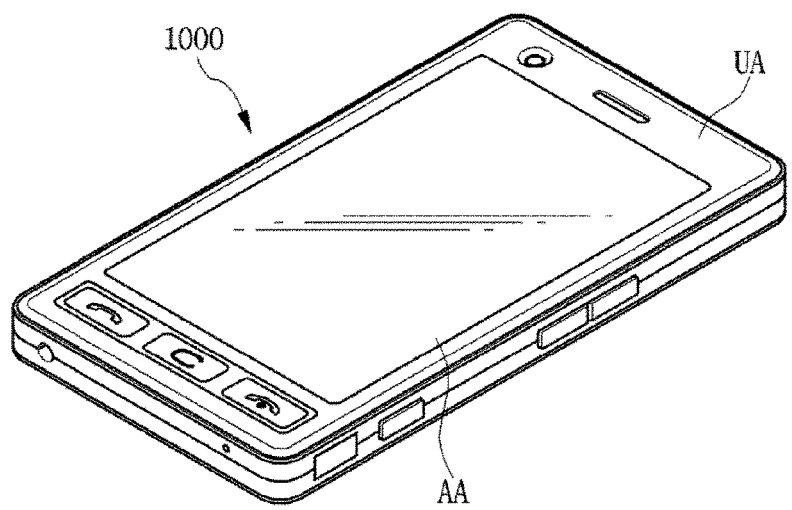
FIGS. 31 to 34 are views showing examples of touch devices employing a touch window according to an embodiment.

Referring to FIG. 31, as one example of a touch device, a mobile terminal is shown. The mobile terminal may include an active area AA and an unactive area UA. The active area AA may sense a touch signal through the touch by a finger, and a command icon pattern part and a logo may be formed in the unactive area UA.

Figure 32:
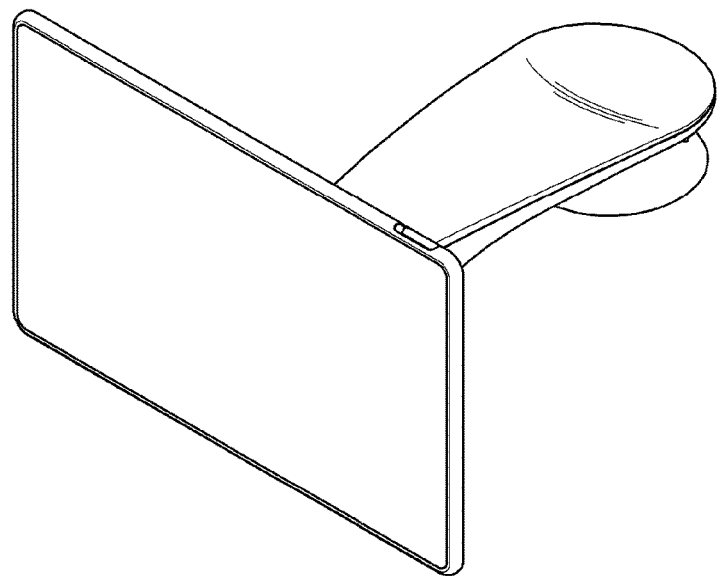

Referring to FIG. 32, the touch window may include a flexible touch window that is capable of being bent. Accordingly, the touch display including the flexible touch window may be a flexible touch display. Thus, a user may bend or curve the flexible touch window with the hand of the user. Such a flexible touch window may be applied to a wearable touch.

Figure 33:
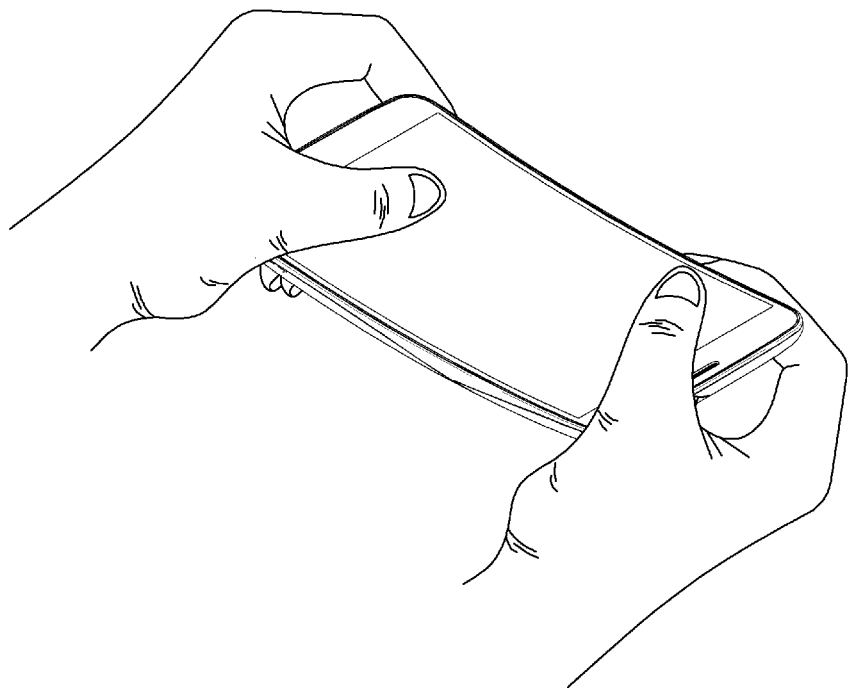

Referring to FIG. 33, the touch window may be applied to a vehicle navigation system as well as a touch device such as a mobile terminal.

Figure 34:

In addition, referring to FIG. 34, the touch window may be applied to an inner part of a vehicle. In other words, the touch window may be applied to various parts in the vehicle. Accordingly, the touch window may be applied to a dashboard 100 as well as a PND (Personal Navigation Display), so that a CID (Center Information Display) may be realized. However, the embodiment is not limited to the above, and such a touch device may be used for various electronic appliances.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A capacitive touch window comprising:
    a substrate including a first surface and a second surface opposite the first surface;
    a cover substrate on the substrate; and
    an electrode on the substrate,
    wherein the electrode comprises:
    a first sensing electrode on the first surface of the substrate facing the cover substrate, and extending in one direction;
    a second sensing electrode on the second surface of the substrate, and extending in another direction different from the one direction,
    a first wire electrode electrically connected to the first sensing electrode, and disposed on the first surface of the substrate; and
    a second wire electrode electrically connected to the second sensing electrode, and disposed on the second surface of the substrate,
    wherein each of the first and second sensing electrodes comprises:
    a first mesh line extending in a first, direction and having a first width;
    a second mesh line extending in a second direction different from the first direction and having a second width;
    a cross area in which the first and second mesh lines cross each other, the cross area having a third width, the third width being a diagonal of the cross area;
    opening parts formed by the first and second mesh lines; and
    a protective layer disposed on the second surface of the substrate,
    wherein each of the first width, the second width and the third width is in the range of 0.1 µm to 10 µm, and
    wherein the third width is 2 to 10 times each of the first width and the second width.

2. The capacitive touch window of claim 1,
    wherein the cover substrate and the substrate include an active area and an unactive area,
    wherein the first and second sensing electrodes are disposed on the active area,
    wherein the first and second wire electrodes are disposed on the unactive area, and
    wherein at least one of the sensing and wire electrodes has a mesh shape.

3. The capacitive touch window of claim 2, further comprising an outer dummy layer disposed on the unactive area of the cover substrate,
    wherein the first and second wire electrodes are disposed on the outer dummy layer.

4. The capacitive touch window of claim 1, wherein the protective layer is disposed on the second sensing electrode.

5. The capacitive touch window of claim 4, wherein the protective layer includes an adhesive material.

6. The capacitive touch window of claim 4, wherein the protective layer includes acrylic resin.

7. The capacitive touch window of claim 4, wherein the protective layer makes direct contact with the electrode.

8. The capacitive touch window of claim 4, wherein the protective layer covers the sensing electrode and the wire electrode.

9. The capacitive touch window of claim 4, wherein the protective layer has a thickness in a range of 2 µm to 30 µm.

10. The capacitive touch window of claim 1, wherein at least one of the first and second mesh lines has a curved end at the cross area.

11. The capacitive touch window of claim 1, wherein the opening part has a diamond shape.

12. The capacitive touch window of claim 1, wherein the cover substrate is glass.

13. The capacitive touch window of claim 1,
    wherein one end of the first wire electrode is electrically connected with the first sensing electrode, and another end of the first wire electrode is electrically connected with a printed circuit board, and
    wherein one end of the second wire electrode is electrically connected with the second sensing electrode, and another end of the second wire electrode is electrically connected with the printed circuit board.

14. The capacitive touch window of claim 1, wherein the third width is defined as a distance between one contact point of the first and second mesh lines and another contact point of the first and second mesh lines, the one contact point and the other contact point facing each other.

15. The capacitive touch window of claim 1, wherein the third width is 2 to 5 times each of the first width and the second width.

16. A touch device comprising;
    a display panel; and a capacitive touch window on the display panel,
wherein the display panel comprises;
a first substrate;
a thin film transistor on the first substrate; and
an organic light emitting device or a liquid crystal device on the thin film transistor,
wherein the capacitive touch window comprises;
a substrate including a first surface and a second surface opposite the first surface;
a cover substrate on the substrate; and
an electrode on the substrate,
wherein the electrode comprises:
a first sensing electrode on the first surface of the substrate facing the cover substrate, and extending in one direction;
a second sensing electrode on the second surface of the substrate, and extending in another direction different from the one direction;
a first wire electrode electrically connected to the first sensing electrode, and disposed on the first surface of the substrate; and
a second wire electrode electrically connected to the second sensing electrode, and disposed on the second surface of the substrate,
wherein each of the first and second sensing electrodes comprises:
a first mesh line extending in a first direction and having a first width;
a second mesh line extending in a second direction different from the first direction and having a second width;
a cross area in which the first and second mesh lines cross each other, the cross area having a third width, the third width being a diagonal of the cross area;
opening parts formed by the first and second mesh lines; and
a protective layer disposed on the second surface of the substrate,
wherein each of the first width, the second width and the third width is in the range of 0.1 μm to 10 μm, and
wherein the third width is 2 to 10 times each of the first width and the second width.

17. The touch device of claim 16, wherein the cover substrate is glass.

18. The touch device of claim 16,
wherein one end of the first wire electrode is electrically connected with the first sensing electrode, and another end of the first wire electrode is electrically connected with a printed circuit board, and
wherein one end of the second wire electrode is electrically connected with the second sensing electrode, and another end of the second wire electrode is electrically connected with the printed circuit board.

19. The touch device of claim 16,
wherein the cover substrate and substrate include an active area and an unactive area,
wherein the touch device further comprises an outer dummy layer disposed on the unactive area of the cover substrate, and
wherein the first and second wire electrodes are disposed on the outer dummy layer.

20. The touch device of claim 16, wherein the third width is defined as a distance between one contact point of the first and second mesh lines and another contact point of the first and second mesh lines, the one contact point and the other contact point facing each other.

21. The touch device of claim 16, wherein the third width is 2 to 5 times each of the first width and the second width.

22. The touch device of claim 16, wherein the substrate is encapsulation substrate.

23. The touch device of claim 16, wherein the protective layer is disposed on the second sensing electrode.

24. The touch device of claim 16, wherein the protective layer has a thickness in a range of 2 μm to 30 μm.

25. The touch device of claim 16, wherein the protective layer includes an adhesive material.

26. The touch device of claim 16, wherein the protective layer includes acrylic resin.

27. The touch device of claim 16, wherein the protective layer covers the sensing electrode and the wire electrode.

28. A capacitive touch window comprising:
a substrate including a first surface and a second surface opposite the first surface;
a cover substrate on the substrate having an active area and an unactive area;
an electrode on the substrate; and
an outer dummy layer disposed on the unactive area,
wherein the electrode comprises:
a first sensing electrode on the first surface of the substrate facing the cover substrate, and extending in one direction;
a second sensing electrode on the second surface of the substrate, and extending in another direction different from the one direction;
a first wire electrode electrically connected to the first sensing electrode, and disposed on the first surface of the substrate; and
a second wire electrode electrically connected to the second sensing electrode, and disposed on the second surface of the substrate,
wherein each of the first and second sensing electrodes comprises:
a first mesh line extending in a first direction and having a first width;
a second mesh line extending in a second direction different from the first direction and having a second width;
a cross area in which the first and second mesh lines cross each other, the cross area having a third width, the third width being a diagonal of the cross area;
opening parts formed by the first and second mesh lines; and
a protective layer disposed on the second surface of the substrate,
wherein the third width is 2 to 10 times each of the first width and the second width,
wherein each of the first width and the second width is in the range of about 0.1 μm to about 10 μm,
wherein the first and second wire electrodes are disposed on the outer dummy layer,
wherein the first and second sensing electrodes include at least one of Cr, Ni, Cu, Al, Ag, Mo, Au, Ti and the alloy thereof,
wherein a cross, angle θ between the first and second mesh lines is in the range of about 60° to about 120°,
wherein the first and second sensing electrodes are disposed on the active area and the unactive area,
wherein a printed circuit board connects the first and second wire electrodes,
wherein the first and second wire electrodes include the same material as that of the first and second sensing electrodes, wherein a transparent adhesive layer is interposed between the cover substrate and the substrate, and
wherein the protective layer is disposed on the active area and the unactive area.

29. The capacitive touch window of claim 28, wherein the protective layer has a thickness in the range of about 2 µm to about 30 µm.

30. The capacitive touch window of claim 28, wherein the outer dummy layer has a black or white color.

31. The capacitive touch window of claim 28, wherein the outer dummy layer includes at least two layers having mutually different widths.

* * * * *